United States Patent
Kajihara et al.

(10) Patent No.: US 11,837,516 B2
(45) Date of Patent: Dec. 5, 2023

(54) SEMICONDUCTOR DEVICE

(71) Applicant: Mitsubishi Electric Corporation, Tokyo (JP)

(72) Inventors: Takanobu Kajihara, Tokyo (JP); Katsuhiko Omae, Tokyo (JP); Takashi Nagao, Tokyo (JP); Atsuki Fujita, Tokyo (JP); Ryosuke Takeshita, Tokyo (JP); Masakazu Hamada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 254 days.

(21) Appl. No.: 17/256,841

(22) PCT Filed: Sep. 6, 2018

(86) PCT No.: PCT/JP2018/032965
§ 371 (c)(1),
(2) Date: Dec. 29, 2020

(87) PCT Pub. No.: WO2020/149672
PCT Pub. Date: Mar. 12, 2020

(65) Prior Publication Data
US 2021/0305111 A1    Sep. 30, 2021

(51) Int. Cl.
*H01L 23/31* (2006.01)
*H01L 23/367* (2006.01)
*H01L 23/495* (2006.01)

(52) U.S. Cl.
CPC .......... *H01L 23/31* (2013.01); *H01L 23/3677* (2013.01); *H01L 23/49568* (2013.01)

(58) Field of Classification Search
CPC ... H01L 21/4821; H01L 21/565; H01L 23/31; H01L 23/3107; H01L 23/3142;
(Continued)

(56) References Cited

U.S. PATENT DOCUMENTS 8,410,601 B2 *   4/2013 Samples ............... H01L 23/057
                                                             257/E23.128
10,461,056 B2 * 10/2019 Mahler ............. H01L 21/02288
(Continued)

FOREIGN PATENT DOCUMENTS

EP   3 285 289 A1   2/2018
JP   2893085 B2    5/1999
(Continued)

OTHER PUBLICATIONS

Communication dated Aug. 19, 2021 by the European Patent Office in application No. 18932539.2.
(Continued)

*Primary Examiner* — Mohammed Shamsuzzaman
(74) *Attorney, Agent, or Firm* — Sughrue Mion, PLLC; Richard C. Turner (57) ABSTRACT

In a semiconductor device, on a heat dissipation portion of a lead frame opposite to a mounting portion on which a semiconductor element is mounted, a thin molding portion having a thickness of about 0.02 mm to 0.3 mm is formed by a second molding resin which is a high-heat-dissipation resin. A scale-like portion on which scale-shaped projections are consecutively formed is provided over both sides across a resin boundary portion of the heat dissipation portion. The scale-like portion reaches abutting surfaces of an upper die and a lower die of a mold used in a molding process. Thus, the same void inhibition effect as with an air vent is obtained.

16 Claims, 10 Drawing Sheets

(58) Field of Classification Search
CPC ............. H01L 23/3677; H01L 23/4821; H01L 23/49548; H01L 23/49568; H01L 24/32; H01L 24/40; H01L 2224/291; H01L 2224/37147; H01L 2224/45124; H01L 2224/45144; H01L 2224/45147; H01L 2224/73221; H01L 2224/73263; H01L 23/49582; H01L 24/48; H01L 2224/29139; H01L 2224/83411; H01L 2224/83444; H01L 2224/83447; H01L 2224/84439; H01L 2224/85444; H01L 2224/32245; H01L 2224/40245; H01L 2224/40499; H01L 2224/45139; H01L 2224/48091; H01L 2224/48247; H01L 2224/73265; H01L 2224/83439; H01L 2224/83455; H01L 2224/84411; H01L 2224/84444; H01L 2224/84447; H01L 2224/84455; H01L 2224/85411; H01L 2224/85439; H01L 2224/85447; H01L 2224/85455; H01L 2924/181

See application file for complete search history.

(56) References Cited

U.S. PATENT DOCUMENTS

| | | | |
|---|---|---|---|
| 10,658,278 B2 * | 5/2020 | Koduri | H01L 21/561 |
| 2004/0089928 A1 * | 5/2004 | Nakajima | H01L 24/32 257/E23.044 |
| 2009/0146280 A1 * | 6/2009 | Shimazaki | H01L 23/49548 257/676 |
| 2016/0315054 A1 * | 10/2016 | Kajihara | H01L 24/36 |
| 2017/0330809 A1 * | 11/2017 | Kajihara | H01L 23/49524 |
| 2018/0005920 A1 * | 1/2018 | Kajihara | H01L 21/565 |
| 2021/0125891 A1 * | 4/2021 | Kajihara | H02K 11/33 |
| 2021/0175141 A1 * | 6/2021 | Kajihara | H01L 21/565 |
| 2021/0175150 A1 * | 6/2021 | Ichinohe | H01L 23/49503 |

FOREIGN PATENT DOCUMENTS

| | | | |
|---|---|---|---|
| JP | 2006049698 A * | 2/2006 | |
| JP | 2017-055044 A | 3/2017 | |
| WO | 2015/151273 A1 | 10/2015 | |
| WO | 2016/166835 A1 | 10/2016 | |
| WO | WO-2016166834 A1 * | 10/2016 | ......... B29C 45/1671 |
| WO | WO-2016166835 A1 * | 10/2016 | ........... H01L 21/565 |
| WO | 2017/154072 A1 | 9/2017 | |

OTHER PUBLICATIONS

International Search Report for PCT/JP2018/032965 dated Oct. 30, 2018 [PCT/ISA/210].
Written Opinion for PCT/JP2018/032965 dated Oct. 30, 2018 [PCT/ISA/237].
Office Action dated Nov. 22, 2022 issued by the Indian Patent Office in Indian Application No. 202127004146.
Office Action dated Aug. 22, 2023 in Chinese Application No. 201880097013.1.

* cited by examiner

SEMICONDUCTOR DEVICE

CROSS REFERENCE TO RELATED APPLICATIONS

This application is a National Stage of International Application No. PCT/JP2018/032965 filed Sep. 6, 2018.

TECHNICAL FIELD

The present disclosure relates to a semiconductor device of a resin molded type.

BACKGROUND ART

As a general resin sealing method for a power module, transfer molding using a molding resin such as epoxy resin is performed. In conventional transfer molding, inside a mold, a void due to air entrapment by flow of the molding resin or gas generated from the molding resin, can occur.

In addition, a void can also occur in an insulation adhesion member having high thermal conductivity, provided between a heatsink and a heat dissipation portion of a semiconductor device. In the case of using a sheet-like insulation adhesion member, a void occurs between the insulation adhesion member and a lead frame by air entrapment at the time of pasting. In the case where a liquid insulation adhesion member is cured and used, a void occurs due to gas of a solvent separated from an adhesive agent during a curing process. In any of the cases, the presence of a void leads to reduction in electric insulation property, moisture-proof property, heat dissipation property, and adhesion property, so that the function of the semiconductor device is lowered.

As conventional technology for inhibiting occurrence of a void at the time of resin sealing, a configuration in which a mold is provided with an air vent for discharging a void, is known. For example, in a resin sealing molding apparatus for an electronic component disclosed in Patent Document 1, a gate is provided at one end of a cavity formed inside an upper die and a lower die, a resin reservoir part is provided near the other end of the cavity on the opposite side from the gate, and the resin reservoir part and the outside communicate with each other through an air vent.

CITATION LIST

Patent Document

Patent Document 1: Japanese Patent No. 2893085

SUMMARY OF THE INVENTION

Problems to be Solved by the Invention

However, in the method of providing the air vent in the mold, it is necessary to provide the air vent in advance at a part where a void is expected to occur, and if a void occurs at an unexpected part, it is necessary to work the mold again. Thus, there is a problem that time and cost are required for working the mold.

The present disclosure has been made to solve the above problem, and an object of the present disclosure is to provide a semiconductor device that inhibits occurrence of a void in a molding resin or an insulation adhesion member and has a high function and high reliability, at low cost.

Solution to the Problems

A semiconductor device according to the present disclosure includes: a lead frame on which a semiconductor element is mounted and which is made of metal; and a resin sealing, of the lead frame, at least a surface on which the semiconductor element is mounted, wherein the lead frame has a scale-like portion on which scale-shaped projections are consecutively formed, and the scale-like portion is provided over both sides across a resin boundary portion which is a boundary between inside and outside of an area sealed by the resin on the lead frame.

Effect of the Invention

The semiconductor device according to the present disclosure has the scale-like portion provided over both sides across the resin boundary portion on the lead frame, whereby air present inside the resin can be discharged to the outside of the mold during a resin sealing process, thus providing a void inhibition effect. Therefore, it is not necessary to work an air vent in the mold and a semiconductor device having a high function and high reliability can be obtained at low cost.

Objects, features, aspects, and effects of the present disclosure other than the above will become more apparent from the following detailed description with reference to the drawings.

DESCRIPTION OF EMBODIMENTS

Embodiment 1

Figure 1:
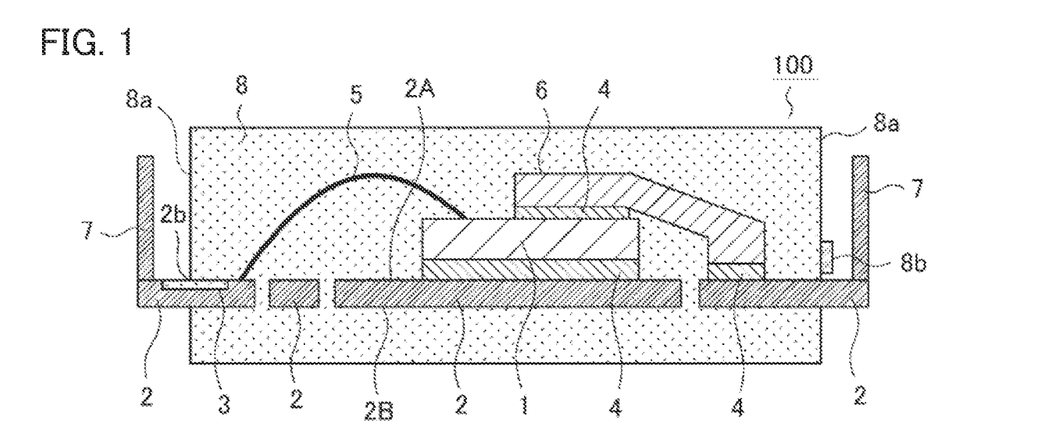
FIG. 1 is a sectional view showing a semiconductor device according to embodiment 1.
Figure 2:
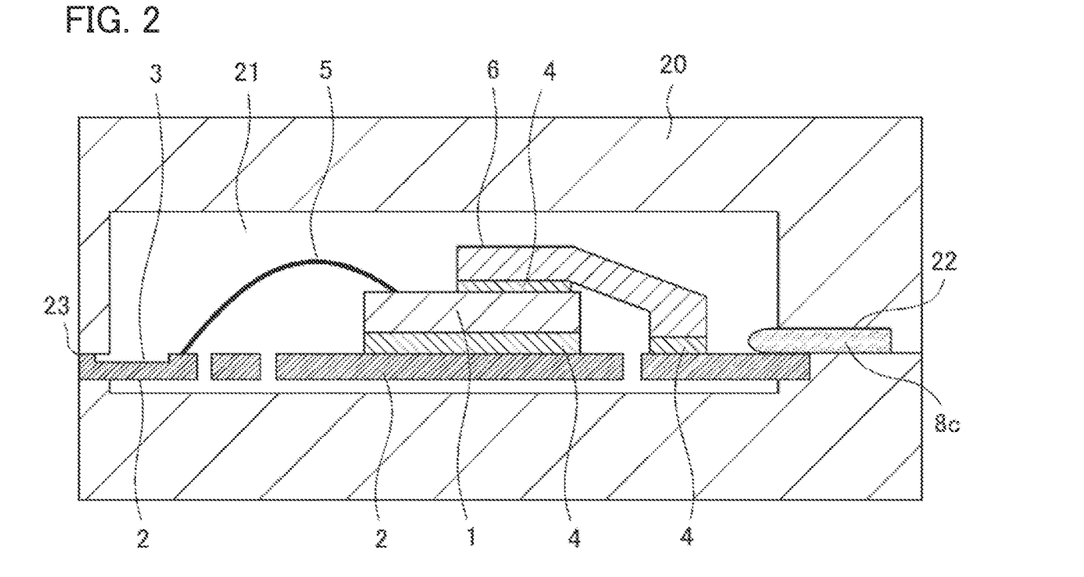
FIG. 2 is a sectional view showing a transfer molding process for the semiconductor device according to embodiment 1.

Hereinafter, a semiconductor device according to embodiment 1 will be described with reference to the drawings. FIG. 1 is a sectional view showing the semiconductor device according to embodiment 1, and FIG. 2 is a sectional view showing a transfer molding process for the semiconductor device according to embodiment 1. A semiconductor device 100 according to embodiment 1 includes a semiconductor element 1, a lead frame 2, a wire 5 and an inner lead 6 which are wiring members, an external terminal 7, a molding resin 8, and the like. In the drawings, the same or corresponding parts are denoted by the same reference characters.

The semiconductor element 1 is, for example, an insulated-gate bipolar transistor (IGBT), a metal-oxide-semiconductor field-effect transistor (MOSFET), an IC chip, an LSI chip, or the like, and is mounted on a mounting portion of the lead frame 2 via a joining member 4 such as solder or silver. It is noted that a component (not shown) other than the semiconductor element 1 is also mounted on the mounting portion of the lead frame 2.

The lead frame 2 is made from a copper plate or a copper alloy plate. For the purpose of improving corrosion resistance and heat resistance, the surface of the lead frame 2 may be coated with a metal plating 2a such as gold, silver, nickel, or tin, and among these, nickel is often employed. The lead frame 2 has a scale-like portion 3 where scale-shaped projections are formed consecutively. The description 'scale-like' means 'similar in appearance to a fish-scale.' The scale-like portion 3 is provided over both sides across a resin boundary portion 2b which is the boundary between the inside and the outside of an area sealed by the molding resin 8 on the lead frame 2. The scale-like portion 3 will be described later in detail.

An electrode pad of the semiconductor element 1 is connected to the external terminal 7 via the wire 5 connected by wire bonding or the inner lead 6 made from a copper plate or a copper alloy plate. The wire 5 and the inner lead 6 may be replaced with each other. The wire 5 is made from gold, silver, aluminum, copper, or the like, and has a wire diameter of about 20 µm to 500 µm.

Of the lead frame 2, at least a surface on which the semiconductor element 1 is mounted is sealed by the molding resin 8 which is a thermosetting resin such as epoxy resin. In the semiconductor device 100 according to embodiment 1, surfaces on both sides of the lead frame 2 are sealed by one type of molding resin 8. The molding resin 8 formed in an approximately rectangular parallelepiped shape has a gate breaking trace 8b at a part of a side surface 8a thereof, and the scale-like portion 3 is provided at the resin boundary portion 2b on the side opposite to the side surface 8a having the gate breaking trace 8b.

The transfer molding process for the semiconductor device 100 according to embodiment 1 will be described with reference to FIG. 2. Inside a mold 20, the lead frame 2 on which the semiconductor element 1 and the like are mounted is placed, and a melted molding resin is injected into a cavity 21 of the mold 20 through a gate 22. The clearance between the external terminal 7 and the mold 20 is made extremely narrow so that a large amount of the molding resin 8 will not leak from the mold 20.

In the transfer molding process, a part to which the straight distance from the gate breaking trace 8b is longest in the semiconductor device 100 (in the case of a rectangular module, a side opposite to the gate breaking trace 8b) is the last part to be filled with the molding resin. The molding resin 8 flows into the last filled part, in a state of being high in viscosity and low in wettability. Therefore, a void due to air entrapment is likely to occur at the last filled part.

Therefore, as means for inhibiting a void in the molding resin 8, the semiconductor device 100 has the scale-like portion 3 provided across the resin boundary portion 2b on the lead frame 2. The scale-like portion 3 reaches abutting surfaces 23 of the upper die and the lower die of the mold 20. The molding resin flowing on the scale-like portion 3 forms a discharge path for air owing to recesses/projections on the scale-like portion 3, whereby air is discharged through the abutting surfaces 23 of the mold 20. The discharge path for air formed in the molding resin disappears when the molding resin is completely cured. Owing to such an action, the scale-like portion 3 exhibits the same void inhibiting effect as with an air vent, without providing an air vent in the mold 20.

The molding resin remaining in the gate 22 is called a runner 8c. After transfer molding, the semiconductor device 100 is taken out from the mold 20, and immediately after this, gate breaking is performed to separate the runner 8c and the semiconductor device 100 from each other. The gate breaking trace 8b remains at the side surface 8a of the molding resin 8 after the gate breaking.

Figure 3:
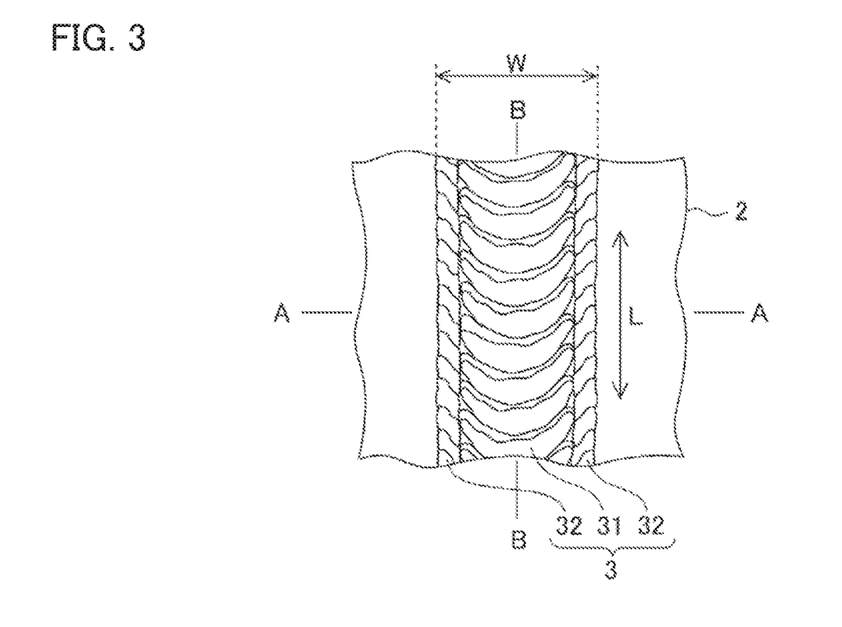
FIG. 3 is a top view showing a scale-like portion in the semiconductor device according to embodiment 1.
Figure 4:
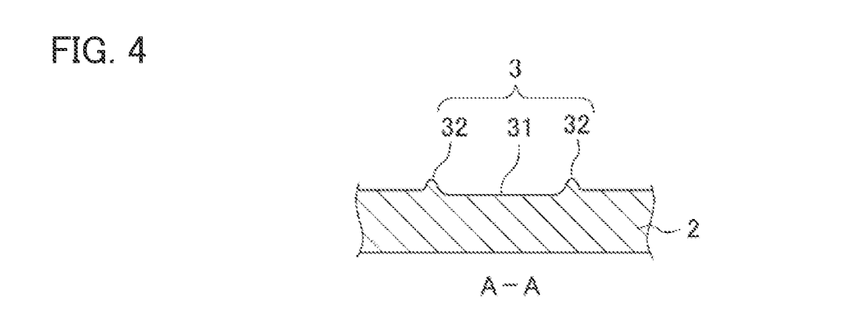
FIG. 4 is a sectional view showing the scale-like portion in the semiconductor device according to embodiment 1.
Figure 5:
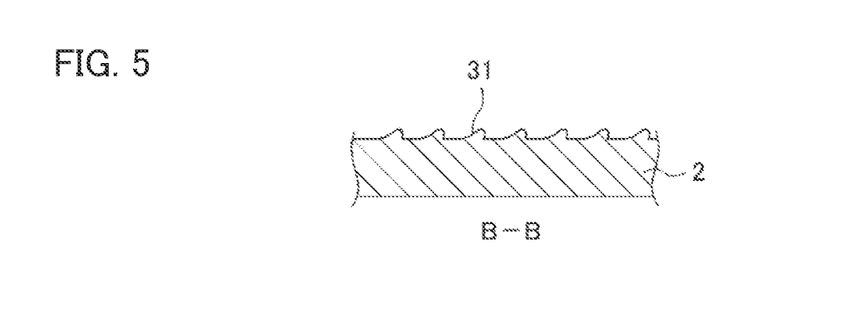
FIG. 5 is a sectional view showing the scale-like portion in the semiconductor device according to embodiment 1.
Figure 6:
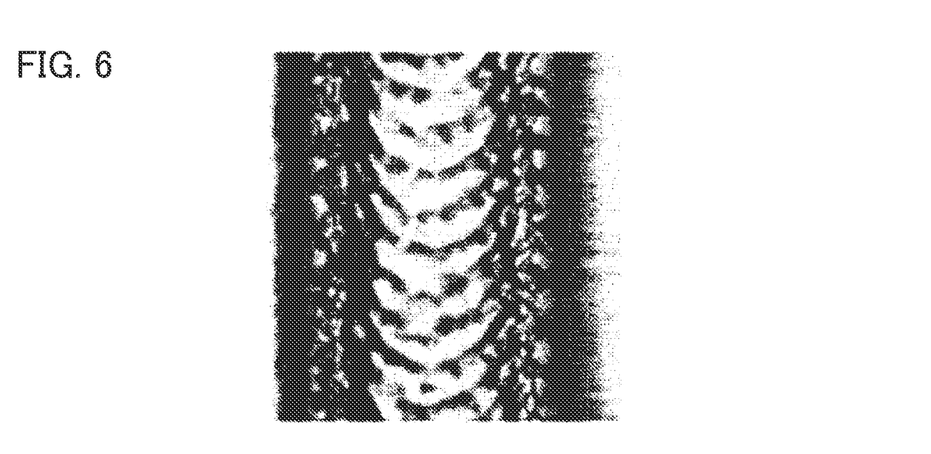
FIG. 6 shows a scanning electron microscope photograph showing the structure of the scale-like portion in the semiconductor device according to embodiment 1.
Figure 7:
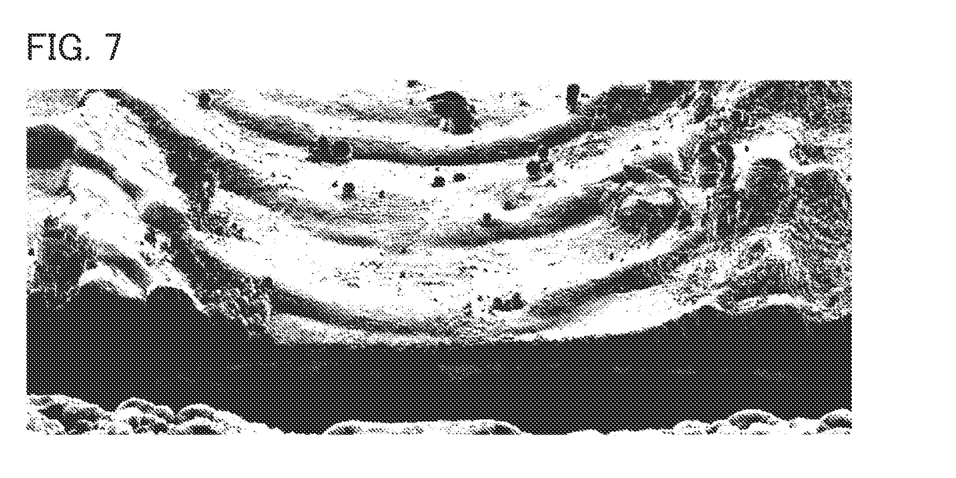
FIG. 7 shows a scanning electron microscope photograph showing the structure of the scale-like portion in the semiconductor device according to embodiment 1.

Next, the structure of the scale-like portion 3 will be described in detail. FIG. 3 is an enlarged top view of a part of the scale-like portion, FIG. 4 is a sectional view cut at a part indicated by A-A in FIG. 3, and FIG. 5 is a sectional view cut at a part indicated by B-B in FIG. 3. FIG. 6 and FIG. 7 are scanning electron microscope photographs showing the structure of the scale-like portion. The scale-like portion 3 is obtained by deforming the surface of the lead frame 2 into a scaly shape by consecutively applying a laser beam as a spot on the lead frame 2, and is formed in a given straight line with a predetermined width W as shown in FIG. 3. In FIG. 3, an arrow denoted by L represents the longitudinal direction of the scale-like portion 3.

The scale-like portion 3 includes a scale portion 31 on which scale-shaped projections are consecutively provided, and ridge portions 32 provided on both sides of the scale portion 31 in parallel to the longitudinal direction L of the scale-like portion 3. As shown in FIG. 7, the ridge portions 32 are raised to be higher than the scale portion 31 and an area between the two ridge portions 32 has a groove shape. The width W and the height of the scale-like portion 3 can be adjusted using laser output, scan speed, and the like. The width W of the scale-like portion 3 is set to about 60 µm to 600 µm, for example. The greater the width W of the scale-like portion 3 is, the higher the void inhibition effect is.

Since the scale-like portion 3 is formed through laser application, the scale-like portion 3 can be easily formed at any location on the lead frame 2, and the flatness of the lead frame 2 is not lost during the working. It is also easy to selectively process only a part where the scale-like portion 3 is to be provided while avoiding a part where the scale-like portion 3 is not to be provided, e.g., a wire connection portion or the like. In addition, the scale-like portion 3 may be provided in a curved line. Further, if the scale-like portion 3 is formed by a unicursal processing pattern, the takt time can be shortened and productivity is improved.

In the case where it has been found that a void is likely to occur at an unexpected part of the semiconductor device 100 through investigation using an ultrasonic imaging device or the like, a long manufacturing period and great cost are required for modifying the mold or newly creating a mold. The scale-like portion 3 is very effective for such a situation, and the scale-like portion 3 only has to be provided at a part where it has been found that a void is likely to occur. Thus, working for the mold is not needed and a void can be coped with at low cost.

Figure 8:
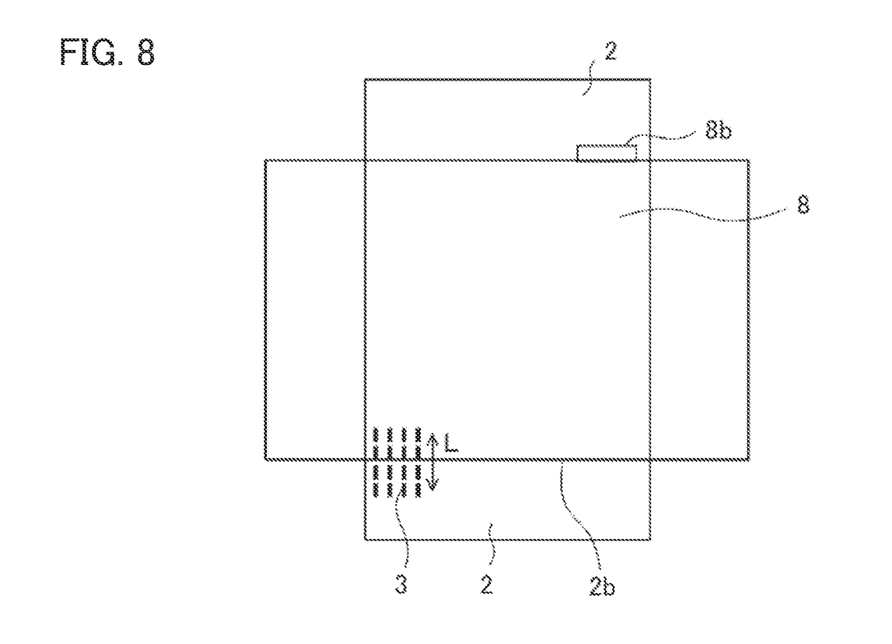
FIG. 8 shows an arrangement example of the scale-like portions in the semiconductor device according to embodiment 1.
Figure 9:
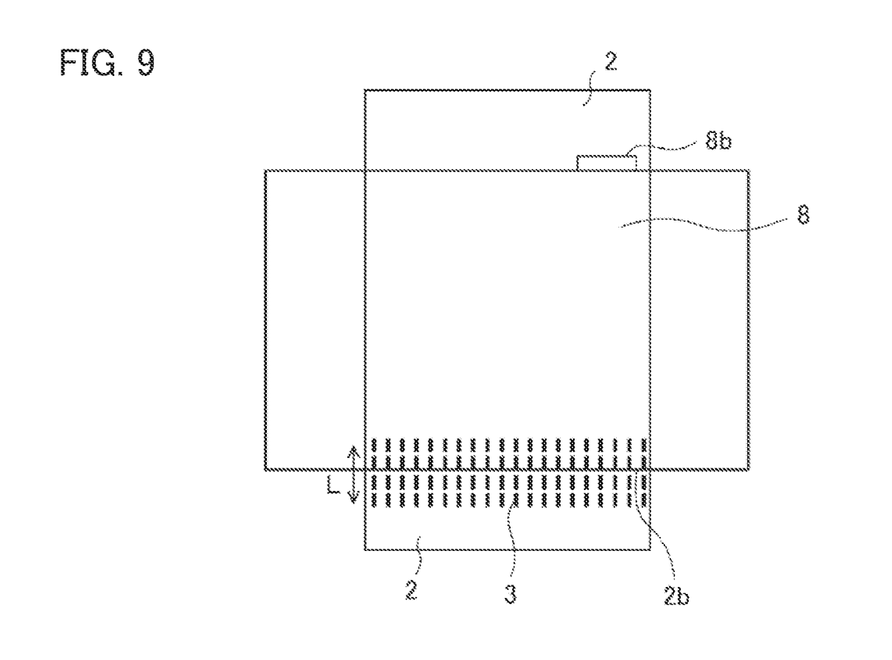
FIG. 9 shows an arrangement example of the scale-like portions in the semiconductor device according to embodiment 1.
Figure 10:
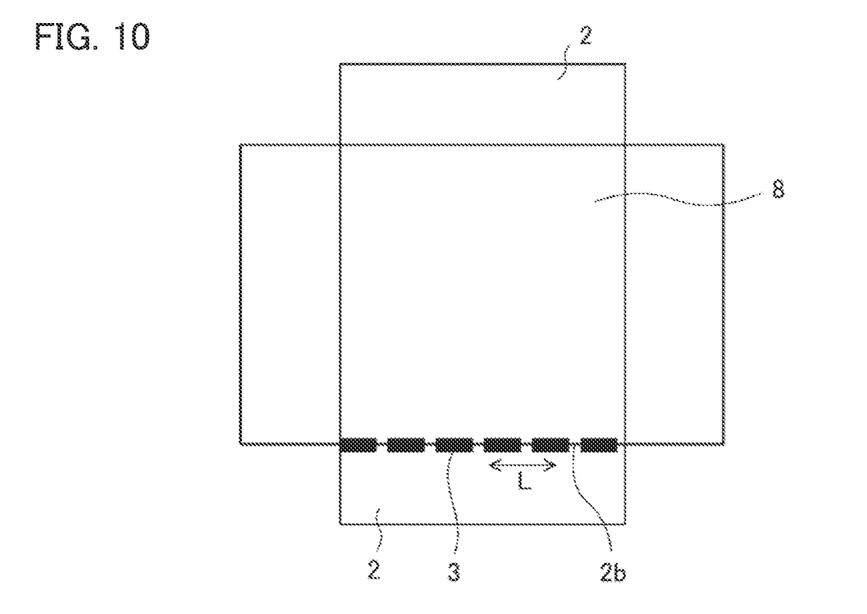
FIG. 10 shows an arrangement example of the scale-like portions in the semiconductor device according to embodiment 1.
Figure 11:
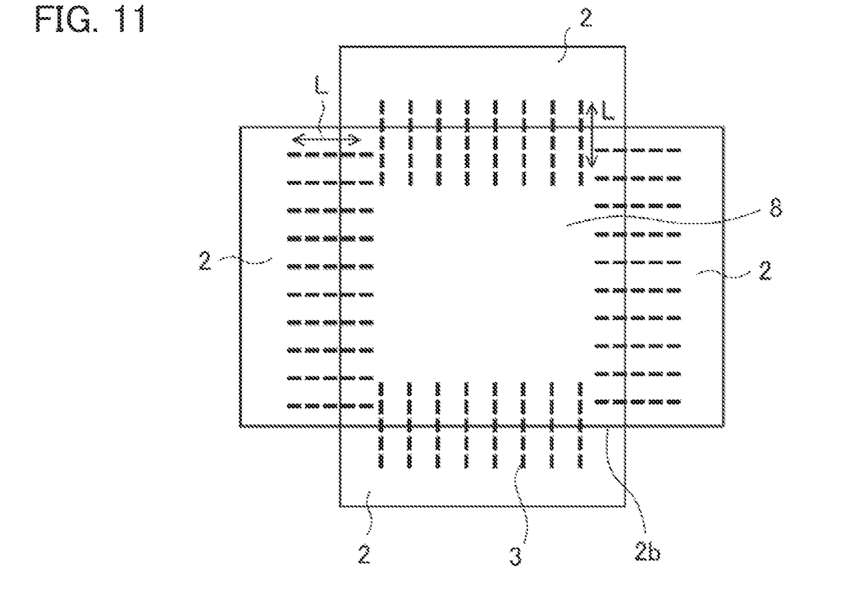
FIG. 11 shows an arrangement example of the scale-like portions in the semiconductor device according to embodiment 1.
Figure 12:
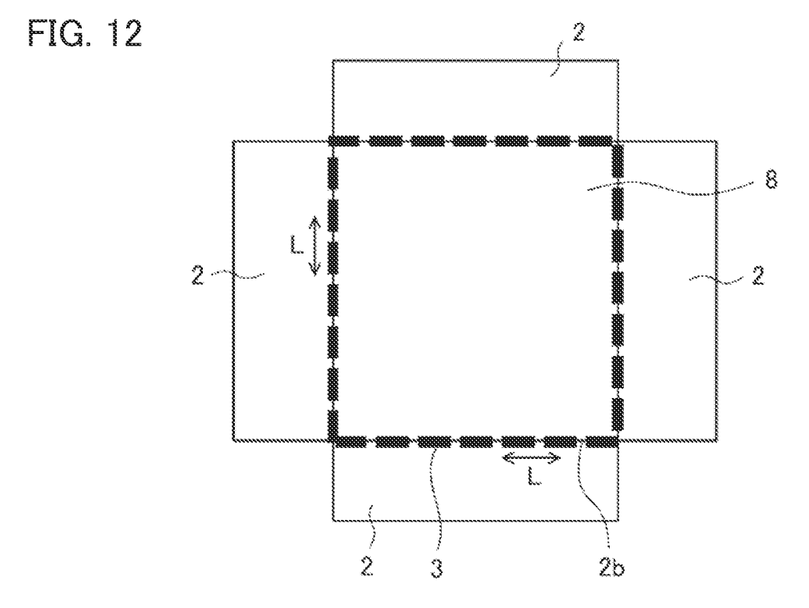
FIG. 12 shows an arrangement example of the scale-like portions in the semiconductor device according to embodiment 1.

Arrangement examples of the scale-like portion 3 and the effects thereof will be described with reference to FIG. 8 to FIG. 12. In FIG. 8, FIG. 9, and FIG. 11, the scale-like portions 3 are arranged such that the longitudinal direction L of the scale-like portions 3 is perpendicular to the resin boundary portion 2b. In FIG. 10 and FIG. 12, the scale-like portions 3 are arranged such that the longitudinal direction L of the scale-like portions 3 is parallel to the resin boundary portion 2b. As shown in FIG. 10 and FIG. 12, in the case where the scale-like portions 3 are arranged such that the longitudinal direction L of the scale-like portions 3 is parallel to the resin boundary portion 2b, considering positional deviation (about 200 µm at maximum) during laser processing, the width W of each scale-like portion 3 is set to be great (for example, about 600 µm) so as to ensure that the scale-like portion 3 is formed across the resin boundary portion 2b.

In the example shown in FIG. 8, a plurality of (here, four) scale-like portions 3 are provided across the resin boundary portion 2b at a part to which the straight distance from the gate breaking trace 8b is longest on the lead frame 2. In the examples shown in FIG. 9 and FIG. 10, a plurality of scale-like portions 3 are provided at intervals on the resin boundary portion 2b on the side opposite to the side surface having the gate breaking trace 8b. Using the configurations as shown in FIG. 8 to FIG. 10 can inhibit a void near the last part to be filled with the molding resin.

In the examples shown in FIG. 11 and FIG. 12, a plurality of scale-like portions 3 are provided at intervals over the entire areas of the resin boundary portions 2b on the four sides of the rectangular module. It is noted that, although the scale-like portions 3 are arranged at equal intervals in FIG. 11, the scale-like portions 3 do not necessarily need to be arranged at equal intervals, and may be closely arranged at a part where a void is likely to occur. Using the configurations as shown in FIG. 11 and FIG. 12 can cope with voids at every part inside the molding resin 8.

Figure 13:
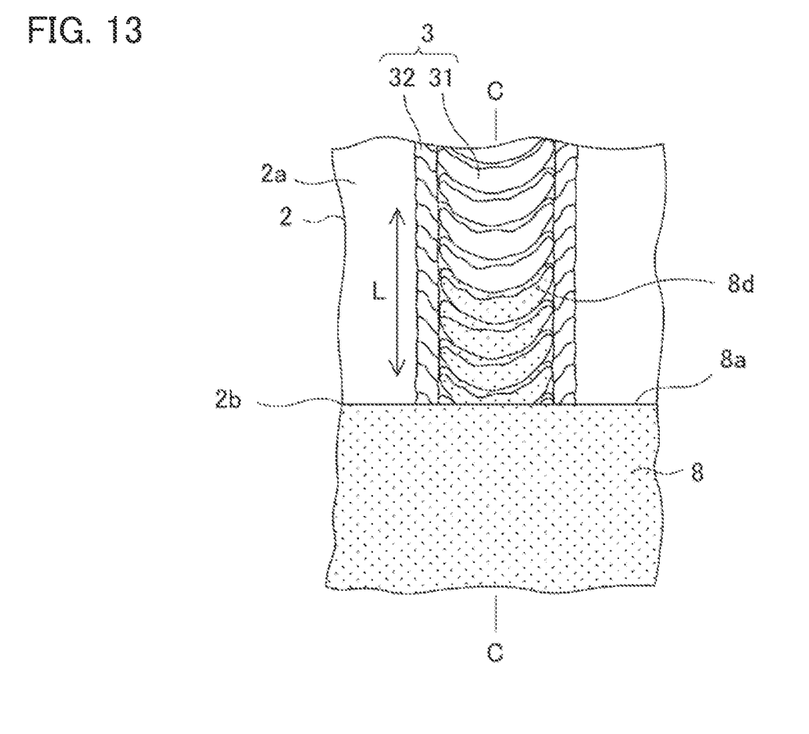
FIG. 13 is a top view illustrating the function of the scale-like portion in the semiconductor device according to embodiment 1.
Figure 14:
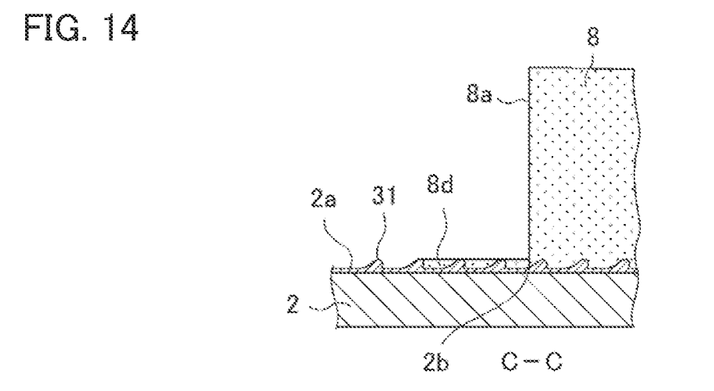
FIG. 14 is a sectional view illustrating the function of the scale-like portion in the semiconductor device according to embodiment 1.
Figure 15:
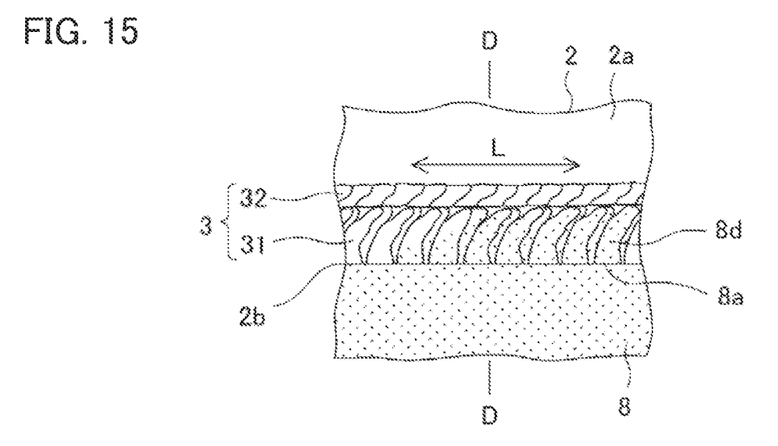
FIG. 15 is a top view illustrating the function of the scale-like portion in the semiconductor device according to embodiment 1.
Figure 16:
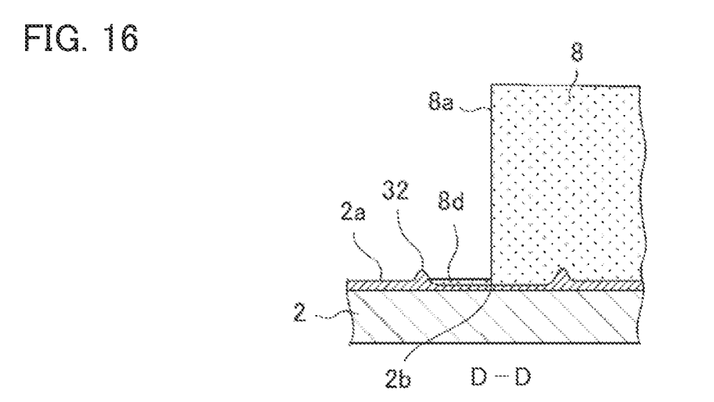
FIG. 16 is a sectional view illustrating the function of the scale-like portion in the semiconductor device according to embodiment 1.

Next, the function of the scale-like portion 3 in the semiconductor device 100 will be described with reference to FIG. 13 to FIG. 16. FIG. 13 is an enlarged top view of a part of the semiconductor device in the case where the longitudinal direction of the scale-like portion is perpendicular to the resin boundary portion, and FIG. 14 is a sectional view cut at a part indicated by C-C in FIG. 13. FIG. 15 is an enlarged top view of a part of the semiconductor device in the case where the longitudinal direction of the scale-like portion is parallel to the resin boundary portion, and FIG. 16 is a sectional view cut at a part indicated by D-D in FIG. 15.

In the examples shown in FIG. 13 to FIG. 16, the surface of the lead frame 2 is coated with the metal plating 2a, and the scale-like portion 3 is formed on the metal plating 2a. Copper which is the material of the lead frame 2 is readily oxidized, and cost is required for management of the oxidation degree if the lead frame 2 is in an exposed state. Therefore, if the scale-like portion 3 is formed with the metal plating 2a remaining on the surface of the lead frame 2, copper oxidation degree management becomes easy. In addition, laser working is easier for the metal plating 2a such as nickel, as compared to copper which has a high reflectance for a laser beam.

In the case of forming the scale-like portion 3 on the lead frame 2 coated with the metal plating 2a, the scale-like portion 3 may be formed at both of the metal plating 2a and the lead frame 2 under the metal plating 2a. That is, the lead frame 2 may be exposed or deformed at the scale-like portion 3. In any case, a void inhibition effect can be obtained in accordance with the dimensions in width W, height, and longitudinal direction L of the scale-like portion 3.

In the transfer molding process, normally, sealing is made at the abutting surfaces 23 of the upper die and the lower die of the mold 20 (see FIG. 2) so that resin will not leak. At this time, if the sealing is loose, resin leakage occurs and unnecessary resin burr is formed. The unnecessary resin burr adversely affects tie bar cutting, lead forming, and the like in the subsequent processes, and it becomes necessary to add a process of removing the resin burr, and therefore this is undesirable.

On the other hand, as shown in FIG. 13 to FIG. 16, at the scale-like portion 3 provided for discharging a void, resin leakage 8d (area represented by dots in the drawings) occurs within the range of the scale-like portion 3. Therefore, the scale-like portion 3 is provided at such a location that any functional problem does not arise even when the resin leakage 8d occurs. The resin leakage amount at the scale-like portion 3 varies depending on the molding pressure, the shape of the scale-like portion 3, or the like. However, the resin leakage 8d occurring at the scale-like portion 3 is accumulated in the scale-like portion 3 and does not spread to a part other than the scale-like portion 3. Therefore, the adverse effect as described above is unlikely to occur.

As shown in FIG. 13 and FIG. 14, in the case where the longitudinal direction L of the scale-like portion 3 is perpendicular to the resin boundary portion 2b, the resin leakage 8d in the longitudinal direction L is inhibited by the scale portion 31, and the resin leakage 8d in the direction (transverse direction in FIG. 13) perpendicular to the longitudinal direction L is inhibited by the ridge portions 32. Thus, the width of the resin leakage 8d can be kept within a narrow range equal to the width W of the scale-like portion.

As shown in FIG. 15 and FIG. 16, in the case where the longitudinal direction L of the scale-like portion 3 is parallel to the resin boundary portion 2b, the resin leakage 8d in the direction (vertical direction in FIG. 15) perpendicular to the longitudinal direction L is inhibited by the ridge portion 32. Thus, the range of the resin leakage 8d can be kept within a short distance from the resin boundary portion 2b to the ridge portion 32. As described above, since the range of the resin leakage 8d varies depending on the arrangement relationship between the longitudinal direction L of the scale-like portion 3 and the resin boundary portion 2b, the arrangement relationship is appropriately selected in accordance with the condition around the part where the scale-like portion 3 is provided.

In embodiment 1, transfer molding is used for the resin sealing process. However, the manufacturing method for the semiconductor device 100 is not limited thereto. For example, injection molding may be used, which can contribute to cost reduction for resin.

As described above, according to embodiment 1, the scale-like portion 3 is provided over both sides across the resin boundary portion 2b on the lead frame 2, whereby air present inside the molding resin can be discharged to the outside of the mold 20 in the resin sealing process, thus providing a void inhibition effect. Since the scale-like portion 3 is formed by applying a laser beam to the lead frame 2, it is possible to easily provide the scale-like portion 3 at a part where a void is likely to occur, and flatness of the lead frame 2 is not lost during working. Further, working for providing an air vent in the mold is not needed, and a void can be coped with at low cost. Thus, according to embodiment 1, the semiconductor device 100 having a high function and high reliability can be obtained at low cost.

Embodiment 2

Figure 17:
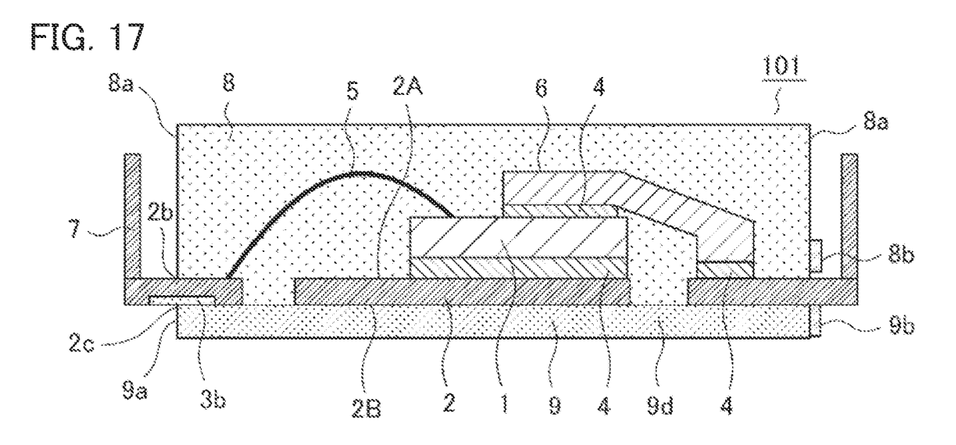
FIG. 17 is a sectional view showing a semiconductor device according to embodiment 2.
Figure 18:
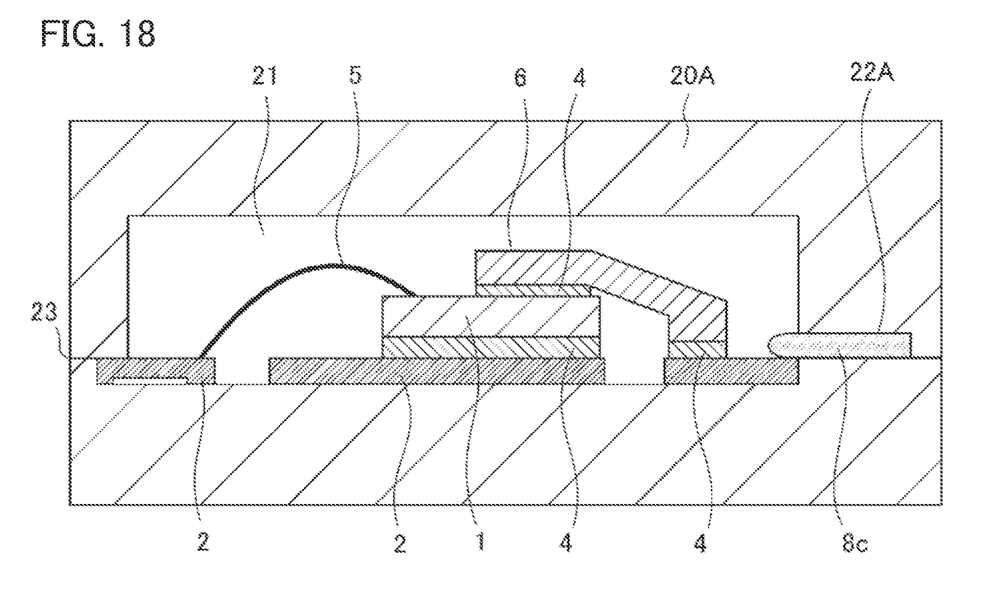
FIG. 18 is a sectional view showing a first-time transfer molding process for the semiconductor device according to embodiment 2.
Figure 19:
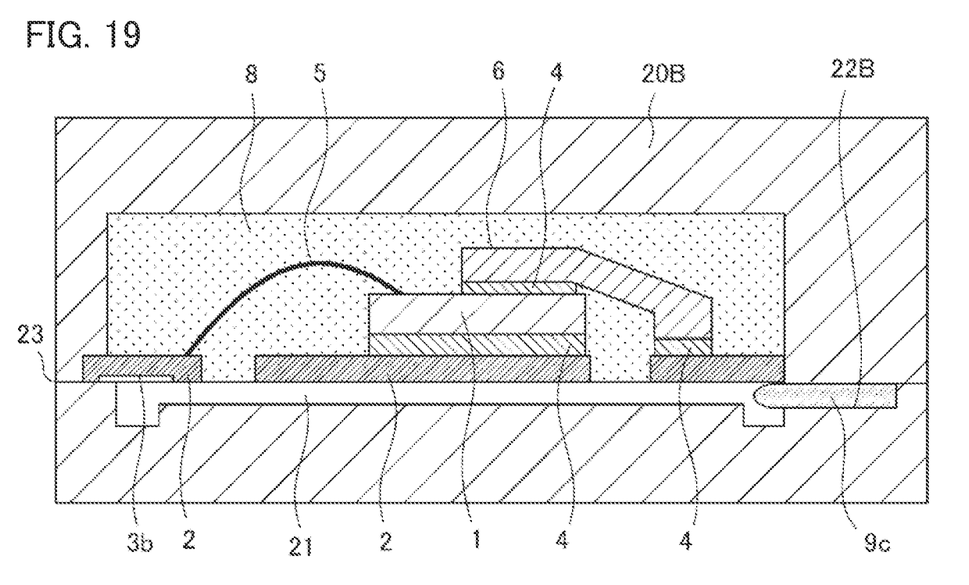
FIG. 19 is a sectional view showing a second-time transfer molding process for the semiconductor device according to embodiment 2.

FIG. 17 is a sectional view showing a semiconductor device according to embodiment 2, FIG. 18 is a sectional view showing a first-time transfer molding process for the semiconductor device according to embodiment 2, and FIG. 19 is a sectional view showing a second-time transfer molding process for the semiconductor device according to embodiment 2. A semiconductor device 101 according to embodiment 2 includes a first resin (hereinafter, molding resin 8) and a second resin (hereinafter, second molding resin 9).

The lead frame 2 of the semiconductor device 101 has a mounting portion 2A on which the semiconductor element 1 is mounted, and a heat dissipation portion 2B opposite to the mounting portion 2A. The mounting portion 2A is sealed by the molding resin 8, and the heat dissipation portion 2B is sealed by the second molding resin 9. A scale-like portion 3b is provided over both sides across a resin boundary portion 2c of an area sealed by the second molding resin 9 on the heat dissipation portion 2B. On the heat dissipation portion 2B of the lead frame 2, a thin molding portion 9d having a thickness of about 0.02 mm to 0.3 mm is formed. The thin molding portion 9d is joined to a heatsink made of copper or aluminum, via a heat dissipation member such as grease.

The molding resin 8 and the second molding resin 9 are both made from thermosetting epoxy resin or the like. It is noted that, for the second molding resin 9 on the heat dissipation portion 2B side, a high-heat-dissipation resin having a higher thermal conductivity than the molding resin 8 is used. The thermal conductivity of the second molding resin 9 is 3 W/m·K to 12 W/m·K. For the molding resin 8 on the mounting portion 2A side, a low-stress resin which is a molding resin for a general integrated circuit is used.

The transfer molding process for the semiconductor device 101 according to embodiment 2 will be described with reference to FIG. 18 and FIG. 19. Manufacturing of the semiconductor device 101 includes two times of transfer molding processes. As shown in FIG. 18, in the first-time transfer molding process, the lead frame 2 on which the semiconductor element 1 and the like are mounted is placed inside a first mold 20A, and the cavity 21 is present on the mounting portion 2A side of the lead frame 2. A melted molding resin is injected into the cavity 21 of the first mold 20A through an upper gate 22A.

The molding resin flows on the mounting portion side of the lead frame 2 to fill the cavity 21. After the first-time transfer molding process, the molded product is taken out from the first mold 20A, and immediately after this, a gate breaking process for separating a runner 8c from the molded product is performed. After the gate breaking, the gate breaking trace 8b (see FIG. 17) remains at the side surface 8a of the molding resin 8.

Subsequently, the second-time transfer molding process is performed. For the purpose of enhancing the adhesion property between the molding resin 8 and the second molding resin 9, a UV treatment or a plasma treatment may be performed on the molding resin 8 after the first-time transfer molding process. As shown in FIG. 19, inside a second mold 20B used in the second-time transfer molding process, the lead frame 2 of which the mounting portion 2A side has been sealed through the first-time transfer molding process is placed, and the cavity 21 is present on the heat dissipation portion 2B side of the lead frame 2.

The melted second molding resin is injected into the cavity 21 through a lower gate 22B. The second molding resin flows into the cavity 21 to form the thin molding portion 9d and flows to the scale-like portion 3b. The second molding resin flowing on the scale-like portion 3b forms a discharge path for air owing to recesses/projections on the scale-like portion 3b, whereby air is discharged through the abutting surfaces 23 of the second mold 20B. After the second-time transfer molding process, the molded product is taken out from the second mold 20B, and immediately after this, a gate breaking process of separating a runner 9c from the molded product is performed. After the gate breaking, a gate breaking trace 9b (see FIG. 17) remains at a side surface 9a of the second molding resin 9.

Figure 20:
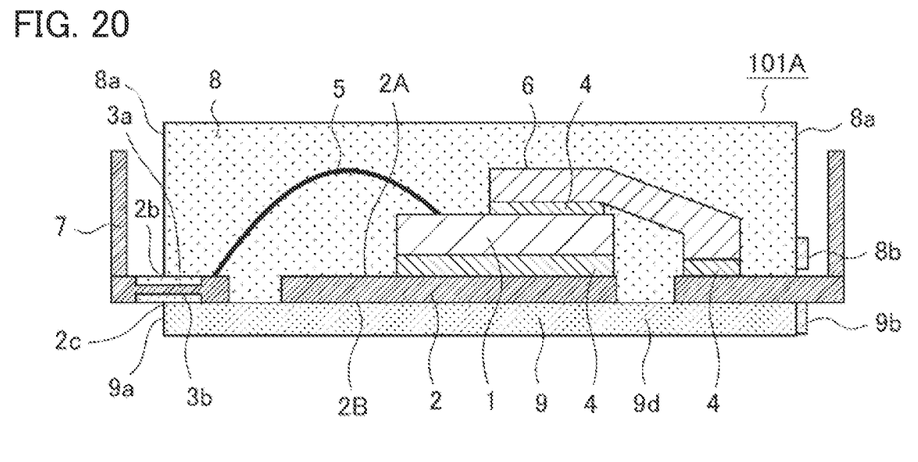
FIG. 20 is a sectional view showing another semiconductor device according to embodiment 2.

The thin molding portion 9d covering the heat dissipation portion 2B of the lead frame 2 is a thin high-heat-dissipation resin which is excellent in heat dissipation property, but has a high flow resistance during molding and thus is poor in fluidity, so that a void due to air entrapment is likely to occur. According to embodiment 2, a void can be effectively inhibited by providing the scale-like portion 3b on the heat dissipation portion 2B side, whereby the semiconductor device 101 which is excellent in heat dissipation property and has a high function and high reliability can be obtained at low cost. It is noted that, in embodiment 2, as in a semiconductor device 101A shown in FIG. 20, a scale-like portion 3a may be provided at the resin boundary portion 2b of the area sealed by the molding resin 8 on the mounting portion 2A, whereby the same effects as in the above embodiment 1 can be obtained.

Embodiment 3

In embodiment 3, a semiconductor device having an insulation adhesion member on the heat dissipation portion 2B side of the lead frame 2 will be described with reference to FIG. 21 to FIG. 23. In a semiconductor device 102 shown in FIG. 21, the mounting portion 2A of the lead frame 2 is sealed by the molding resin 8, and an insulation adhesion member 10 is provided on the heat dissipation portion 2B. In a semiconductor device 103 shown in FIG. 22, a heatsink 11 is provided on the heat dissipation portion 2B of the lead frame 2 with an insulation adhesion member 10 interposed therebetween.

The insulation adhesion member 10 is made of mainly epoxy resin, ceramic, silicone, or the like, and is a high-thermal-conductivity member having a thermal conductivity of 1 W/m·K to 15 W/m·K. As the insulation adhesion member 10, a sheet-like member may be used or a liquid insulation adhesion member may be cured and used. In the case of the sheet-like insulation adhesion member 10, a void can occur at a pasted surface of the insulation adhesion member 10 due to air entrapment at the time of pasting. In the case of curing the liquid insulation adhesion member 10 to be used, a void due to gas of a solvent or the like separated from the adhesive agent during the curing process can occur inside the insulation adhesion member 10. Both of the above cases can cause reduction in electric insulation property, moisture-proof property, heat dissipation property, and adhesion property. Therefore, a void needs to be inhibited and it is effective to provide the scale-like portion 3b.

Figure 21:
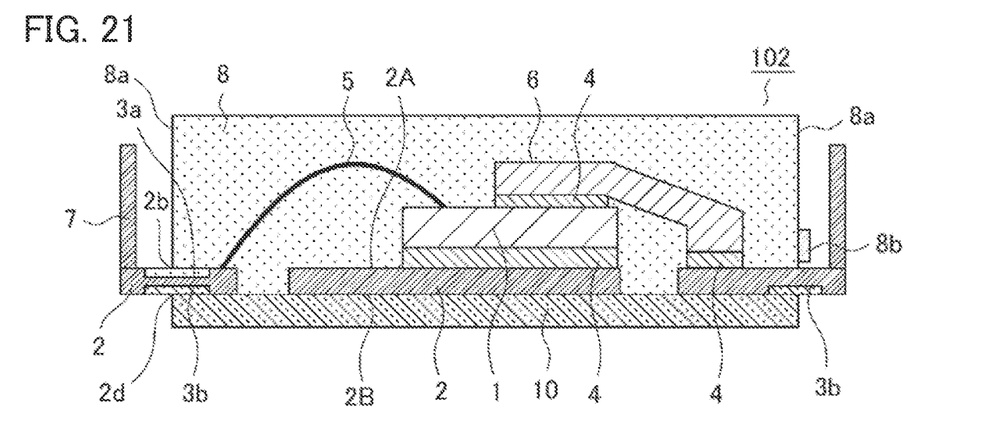
FIG. 21 is a sectional view showing a semiconductor device according to embodiment 3.
Figure 22:
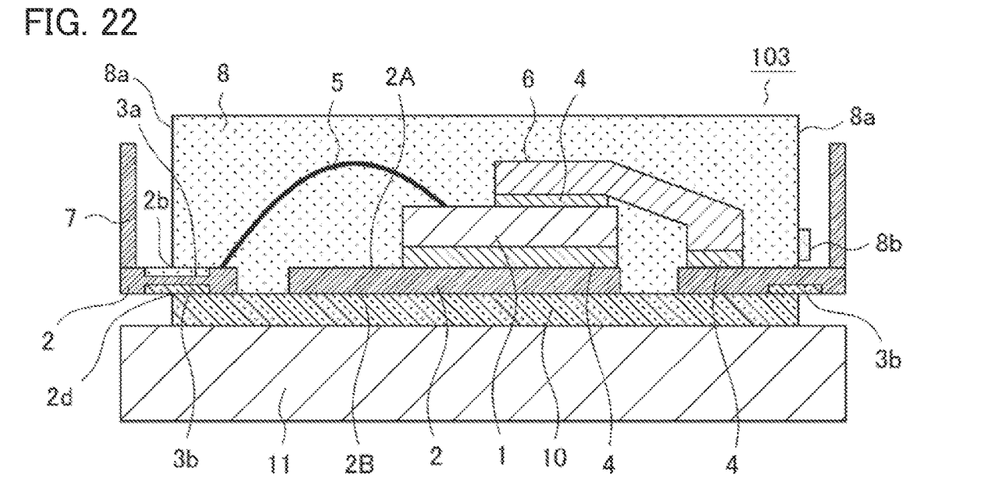
FIG. 22 is a sectional view showing another semiconductor device according to embodiment 3.

In the examples shown in FIG. 21 and FIG. 22, the scale-like portion 3a is provided over both sides across the resin boundary portion 2b on the mounting portion 2A of the lead frame 2. The function of the scale-like portion 3a is the same as in the above embodiment 1 and therefore description thereof is omitted. Further, the scale-like portion 3b is provided over both sides across an insulation adhesion member boundary portion 2d which is the boundary between the inside and the outside of an area covered by the insulation adhesion member 10 on the heat dissipation portion 2B of the lead frame 2. Thus, air entrapped when the sheet-like insulation adhesion member 10 is pasted or gas of a solvent separated during the curing process of the liquid insulation adhesion member 10 is discharged through the scale-like portion 3b, whereby a void is inhibited.

Figure 23:
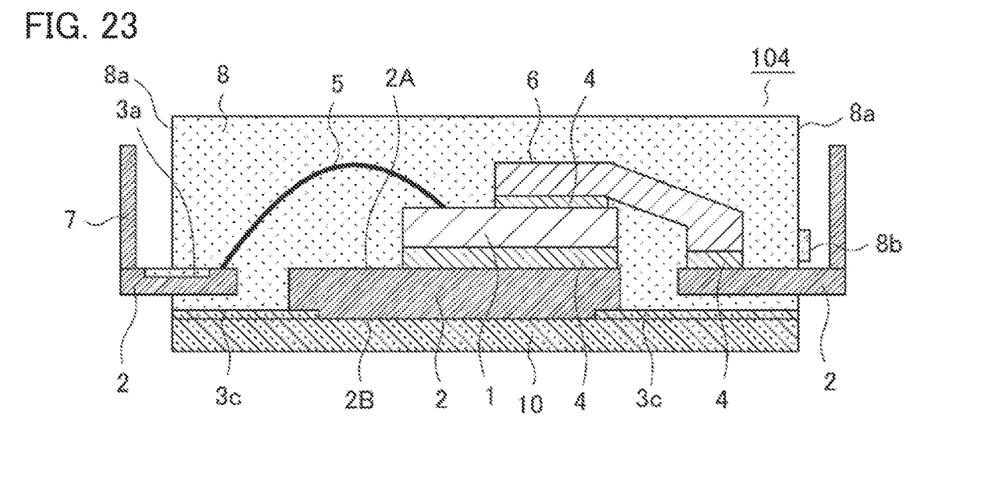
FIG. 23 is a sectional view showing still another semiconductor device according to embodiment 3.

In a semiconductor device 104 shown in FIG. 23, the thickness of the lead frame 2 differs between the part where the semiconductor element 1 is mounted and the part having the external terminal 7. Therefore, around the heat dissipation portion 2B of the lead frame 2, the molding resin 8 is flush with the heat dissipation portion 2B. Further, the insulation adhesion member 10 is provided on the heat dissipation portion 2B and the molding resin 8 being flush with the heat dissipation portion 2B. In this case, merely providing the scale-like portion on the heat dissipation portion 2B side of the lead frame 2 cannot obtain a void inhibition effect.

Accordingly, in the semiconductor device 104, a scale-like portion 3c is formed continuously to the end of the molding resin 8, i.e., the side surface 8a from the heat dissipation portion 2B of the lead frame 2 covered by the insulation adhesion member 10. Thus, air inside the insulation adhesion member 10 or at the pasted surface thereof can be discharged, whereby a void inhibition effect is obtained. It is noted that the scale-like portion 3c can be formed by one-time processing without changing the laser application condition between the heat dissipation portion 2B of the lead frame 2 and the molding resin 8. Alternatively, it is also possible to perform processing with different application conditions for the heat dissipation portion 2B and the molding resin 8 by switching an application program during one-time processing.

Further, the heatsink 11 (see FIG. 22) may be provided on the heat dissipation portion 2B of the semiconductor device 104 shown in FIG. 23, with the insulation adhesion member 10 interposed therebetween. Providing the heatsink 11 obtains a semiconductor device having a small interfacial thermal resistance and excellent heat dissipation property. It is noted that a glass epoxy substrate or the like may be provided on the heat dissipation portion 2B of the lead frame 2 with the insulation adhesion member 10 interposed therebetween.

According to embodiment 3, even in the case where the insulation adhesion member 10 is provided on the heat dissipation portion 2B side of the lead frame 2, it is possible to inhibit a void at the insulation adhesion member owing to the scale-like portions 3b, 3c, and thus the semiconductor devices 102, 103, 104 which are excellent in heat dissipation property and have a high function and high reliability can be obtained at low cost.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure. It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 semiconductor element
2 lead frame
2a metal plating
2b, 2c resin boundary portion
2d insulation adhesion member boundary portion
2A mounting portion
2B heat dissipation portion
3, 3a, 3b, 3c scale-like portion
4 joining member
5 wire
6 inner lead
7 external terminal
8 molding resin
9 second molding resin
8a, 9a side surface
8b, 9b gate breaking trace
8c, 9c runner
8d resin leakage
9d thin molding portion
10 insulation adhesion member
11 heatsink
20 mold
20A first mold
20B second mold
21 cavity
22 gate 22A upper gate
22B lower gate
23 abutting surface
31 scale portion
32 ridge portion
100, 101, 101A, 102, 103, 104 semiconductor device

The invention claimed is:

1. A semiconductor device comprising:
a mounting portion of a lead frame on which a semiconductor element is mounted and which is made of metal;
a heat dissipation portion opposite to the mounting portion; and
a resin sealing the mounting portion on which the semiconductor element is mounted and the heat dissipation portion, wherein
the lead frame has a scale-like portion on which scale-shaped projections are consecutively formed, and
the scale-like portion is provided over both sides across a resin boundary portion which is a boundary between inside and outside of an area sealed by the resin on the lead frame, wherein the scale-like portion is configured to provide a discharge path for a gas from the inside of the area to the outside of the area at a time of a molding of the resin to the lead frame.

2. The semiconductor device according to claim 1, wherein
the scale-like portion includes a scale portion on which the scale-shaped projections are consecutively provided, first and second ridge portions provided on first and second sides of the scale portion, respectively, the first and second ridge portions being raised to be higher than the scale portion, and an area between the first and second ridge portions having a groove shape.

3. The semiconductor device according to claim 1, wherein
a plurality of the scale-like portions are provided at intervals from each other.

4. The semiconductor device according to claim 1, wherein
the scale-like portion is provided in a straight line, a longitudinal direction of the scale-like portion is perpendicular to the resin boundary portion, and the discharge path is parallel with the longitudinal direction.

5. The semiconductor device according to claim 2, wherein
the scale-like portion is provided in a straight line, and a longitudinal direction of the scale-like portion is perpendicular to the resin boundary portion.

6. The semiconductor device according to claim 3, wherein
the scale-like portion is provided in a straight line, and a longitudinal direction of the scale-like portion is perpendicular to the resin boundary portion.

7. The semiconductor device according to claim 1, wherein
the scale-like portion is provided in a straight line, a longitudinal direction of the sc ale-like portion is parallel to the resin boundary portion, and the discharge path is perpendicular to the longitudinal direction.

8. The semiconductor device according to claim 2, wherein
the scale-like portion is provided in a straight line, and a longitudinal direction of the scale-like portion is parallel to the resin boundary portion.

9. The semiconductor device according to claim 3, wherein
the scale-like portion is provided in a straight line, and a longitudinal direction of the scale-like portion is parallel to the resin boundary portion.

10. A semiconductor device comprising:
a mounting portion of a lead frame on which a semiconductor element is mounted and which is made of metal;
a heat dissipation portion opposite to the mounting portion; and
a resin sealing the mounting portion on which the semiconductor element is mounted and the heat dissipation portion, wherein
the lead frame has a scale-like portion on which scale-shaped projections are consecutively formed, and
the scale-like portion is provided over both sides across a resin boundary portion which is a boundary between inside and outside of an area sealed by the resin on the lead frame, wherein the resin has a gate breaking trace at a part of a side surface thereof, and the scale-like portion is provided at the resin boundary portion to which a straight distance from the gate breaking trace is longest.

11. A semiconductor device comprising:
a mounting portion of a lead frame on which a semiconductor element is mounted and which is made of metal;
a heat dissipation portion opposite to the mounting portion; and
a resin sealing the mounting portion on which the semiconductor element is mounted and the heat dissipation portion, wherein
the lead frame has a scale-like portion on which scale-shaped projections are consecutively formed, and
the scale-like portion is provided over both sides across a resin boundary portion which is a boundary between inside and outside of an area sealed by the resin on the lead frame, wherein the resin has a gate breaking trace at a part of a side surface thereof, and the scale-like portion is provided at the resin boundary portion on a side opposite to the side surface having the gate breaking trace.

12. The semiconductor device according to claim 1, wherein
the scale-like portion is provided over an entire area of the resin boundary portion.

13. The semiconductor device according to claim 1, comprising a metal plating covering a part or an entirety of a surface of the lead frame, wherein the scale-like portion is formed at the metal plating.

14. The semiconductor device according to claim 1, comprising a metal plating covering a part or an entirety of a surface of the lead frame, wherein the scale-like portion is formed at the metal plating and the lead frame.

15. The semiconductor device according to claim 1, wherein
the resin includes a first resin sealing the mounting portion and a second resin sealing the heat dissipation portion, and the heat dissipation portion is provided with a thin molding portion formed by the second resin, and
the scale-like portion is provided over both sides across the resin boundary portion of an area sealed by the second resin on the heat dissipation portion.

16. The semiconductor device according to claim 15, wherein the scale-like portion is provided over both sides across the resin boundary portion of an area sealed by the first resin on the mounting portion.

* * * * *